United States Patent
Chepulskyy et al.

(10) Patent No.: US 10,003,015 B2
(45) Date of Patent: Jun. 19, 2018

(54) METHOD AND SYSTEM FOR PROVIDING A DILUTED FREE LAYER MAGNETIC JUNCTION USABLE IN SPIN TRANSFER TORQUE APPLICATIONS

(71) Applicant: Samsung Electronics Co., LTD., Gyeonggi-do (KR)

(72) Inventors: Roman Chepulskyy, Milpitas, CA (US); Dmytro Apalkov, San Jose, CA (US)

(73) Assignee: Samsung Electronics Co., Ltd., Gyeongggi-do (KR)

( * ) Notice: Subject to any disclaimer, the term of this patent is extended or adjusted under 35 U.S.C. 154(b) by 55 days.

(21) Appl. No.: 15/367,033

(22) Filed: Dec. 1, 2016

(65) Prior Publication Data
US 2018/0102476 A1 Apr. 12, 2018

Related U.S. Application Data
(60) Provisional application No. 62/405,595, filed on Oct. 7, 2016.

(51) Int. Cl.
*H01L 43/10* (2006.01)
*H01L 43/12* (2006.01)
(Continued)

(52) U.S. Cl.
CPC ............ *H01L 43/10* (2013.01); *G11C 11/161* (2013.01); *G11C 11/165* (2013.01);
(Continued)

(58) Field of Classification Search
CPC ......... H01L 43/02; H01L 43/08; H01L 43/10; G11C 11/14–11/16; G11C 11/161
See application file for complete search history.

(56) References Cited

U.S. PATENT DOCUMENTS 7,821,087 B2 10/2010 Nguyen
7,924,607 B2 4/2011 Yoshikawa
(Continued)

OTHER PUBLICATIONS

"Impurity-induced enhancement of perpendicular magnetic anisotropy in Fe/MgO tunnel junctions," A. Hallal, B.Dieny and M. Chshiev, Physical Review B 90, 064422 (2014), 6pp.

*Primary Examiner* — Allison P Bernstein
(74) *Attorney, Agent, or Firm* — Convergent Law Group LLP

(57) ABSTRACT

A magnetic junction and method for providing the magnetic junction are described. The magnetic junction resides on a substrate and is usable in a magnetic device. The magnetic junction includes free and pinned layers separated by a nonmagnetic spacer layer. The free layer is switchable between stable magnetic states when a write current is passed through the magnetic junction. The free layer has a free layer perpendicular magnetic anisotropy energy greater than a free layer out-of-plane demagnetization energy. The free layer also includes a diluted magnetic layer having an out-of-plane demagnetization energy and a perpendicular magnetic anisotropy greater than the out-of-plane demagnetization energy. The diluted magnetic layer includes at least one magnetic material and at least one nonmagnetic material. The diluted magnetic layer has an exchange stiffness that is at least eighty percent of an exchange stiffness for the magnetic material(s).

20 Claims, 6 Drawing Sheets

(51) Int. Cl.
  *H01L 43/08* (2006.01)
  *H01L 27/22* (2006.01)
  *G11C 11/16* (2006.01)

(52) U.S. Cl.
  CPC ............ *H01L 27/226* (2013.01); *H01L 43/08* (2013.01); *H01L 43/12* (2013.01)

(56) References Cited

U.S. PATENT DOCUMENTS

| | | |
|---|---|---|
| 8,729,647 B2 | 5/2014 | Lee |
| 8,749,003 B2 | 6/2014 | Horng |
| 8,823,118 B2 | 9/2014 | Horng |
| 9,048,411 B2 | 6/2015 | Jan |
| 9,082,960 B2 | 7/2015 | Jan |
| 2005/0201022 A1 | 9/2005 | Horng |
| 2007/0085068 A1 | 4/2007 | Apalkov |
| 2010/0096716 A1 | 4/2010 | Yadav |
| 2013/0078482 A1 | 3/2013 | Shukh |
| 2015/0295167 A1 | 10/2015 | Apalkov |
| 2016/0125924 A1* | 5/2016 | Kita ................. G11C 11/161 365/158 |
| 2017/0110506 A1* | 4/2017 | Brown ................. H01L 27/222 |
| 2017/0140804 A1* | 5/2017 | Apalkov ............... G11C 11/161 |

* cited by examiner

METHOD AND SYSTEM FOR PROVIDING A DILUTED FREE LAYER MAGNETIC JUNCTION USABLE IN SPIN TRANSFER TORQUE APPLICATIONS

CROSS-REFERENCE TO RELATED APPLICATIONS

This application claims the benefit of provisional Patent Application Ser. No. 62/405,595, filed Oct. 7, 2016, entitled STT-MRAM SWITCHING IMPROVEMENT BY FREE LAYER DILUTION WITHOUT EXCHANGE STIFFNESS REDUCTION, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, a conventional magnetic tunneling junction (MTJ) may be used in a conventional STT-MRAM. The conventional MTJ typically resides on a substrate. The conventional MTJ, uses conventional seed layer(s), may include capping layers and may include a conventional antiferromagnetic (AFM) layer. The conventional MTJ includes a conventional pinned layer, a conventional free layer and a conventional tunneling barrier layer between the conventional pinned and free layers. A bottom contact below the conventional MTJ and a top contact on the conventional MTJ may be used to drive current through the conventional MTJ in a current-perpendicular-to-plane (CPP) direction.

The conventional pinned layer and the conventional free layer are magnetic. The magnetization of the conventional pinned layer is fixed, or pinned, in a particular direction. The conventional free layer has a changeable magnetization. The conventional free layer may be a single layer or include multiple layers.

To switch the magnetization of the conventional free layer, a current is driven perpendicular to plane. When a sufficient current is driven from the top contact to the bottom contact, the magnetization of the conventional free layer may switch to be parallel to the magnetization of a conventional bottom pinned layer. When a sufficient current is driven from the bottom contact to the top contact, the magnetization of the free layer may switch to be antiparallel to that of the bottom pinned layer. The differences in magnetic configurations correspond to different magnetoresistances and thus different logical states (e.g. a logical "0" and a logical "1") of the conventional MTJ.

Because of their potential for use in a variety of applications, research in magnetic memories is ongoing. Mechanisms for improving the performance of STT-MRAM are desired. For example, a lower switching current may be desired for easier and faster switching. Concurrently, the magnetic junction is desired to remain thermally stable. Accordingly, what is needed is a method and system that may improve the performance of the spin transfer torque based memories. The method and system described herein address such a need.

BRIEF SUMMARY OF THE INVENTION

A magnetic junction and method for providing the magnetic junction are described. The magnetic junction resides on a substrate and is usable in a magnetic device. The magnetic junction includes free and pinned layers separated by a nonmagnetic spacer layer. The free layer is switchable between stable magnetic states when a write current is passed through the magnetic junction. The free layer has a free layer perpendicular magnetic anisotropy energy greater than a free layer out-of-plane demagnetization energy. The free layer also includes a diluted magnetic layer having an out-of-plane demagnetization energy and a perpendicular magnetic anisotropy greater than the out-of-plane demagnetization energy. The diluted magnetic layer includes at least one magnetic material and at least one nonmagnetic material. The diluted magnetic layer has an exchange stiffness that is at least eighty percent of an exchange stiffness for the magnetic material(s).

The magnetic junction having the diluted magnetic layer in the free layer may have improved performance. The diluted magnetic layer may have a reduced magnetic moment and increased thickness while substantially maintaining the exchange stiffness. As a result, switching performance may be improved.

DETAILED DESCRIPTION OF THE INVENTION

Figure 1:
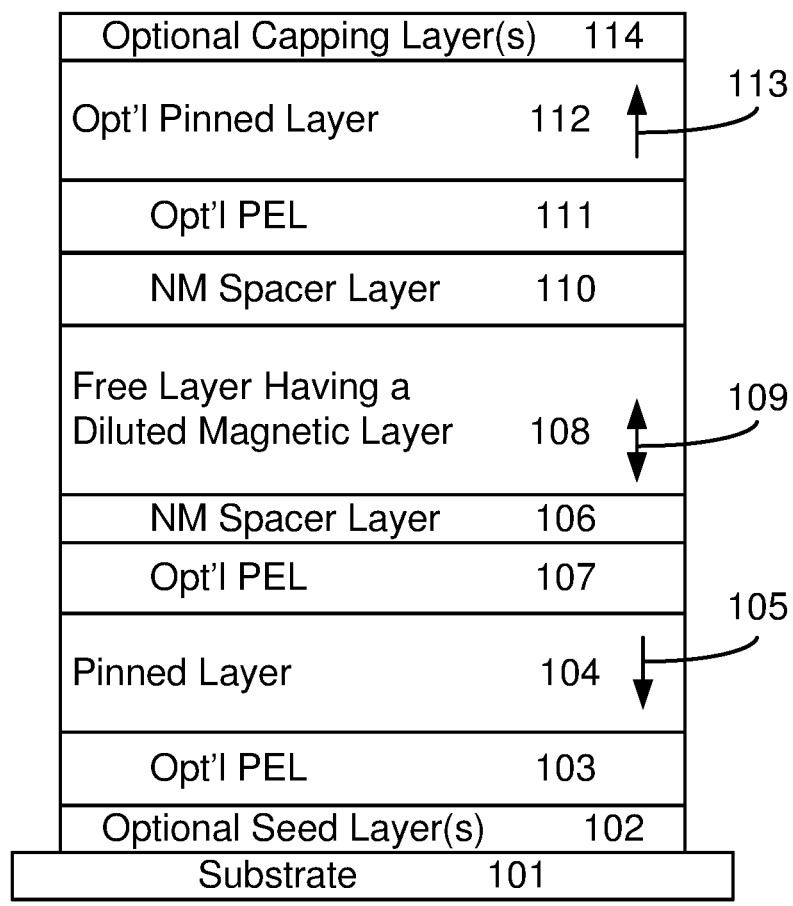
FIG. 1 depicts an exemplary embodiment of a magnetic junction usable in a magnetic devices such as a magnetic memory programmable using spin transfer torque and having a free layer including a diluted magnetic layer.

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

A magnetic junction and method for providing the magnetic junction are described. The magnetic junction resides on a substrate and is usable in a magnetic device. The magnetic junction includes free and pinned layers separated by a nonmagnetic spacer layer. The free layer is switchable between stable magnetic states when a write current is passed through the magnetic junction. The free layer has a free layer perpendicular magnetic anisotropy energy greater than a free layer out-of-plane demagnetization energy. The free layer also includes a diluted magnetic layer having an out-of-plane demagnetization energy and a perpendicular magnetic anisotropy greater than the out-of-plane demagnetization energy. The diluted magnetic layer includes at least one magnetic material and at least one nonmagnetic material. The diluted magnetic layer has an exchange stiffness that is at least eighty percent of an exchange stiffness for the magnetic material(s).

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction. The method and system are also described in the context of certain alloys. Unless otherwise specified, if specific concentrations of the alloy are not mentioned, any stoichiometry not inconsistent with the method and system may be used. For example, CoFeB and FeV refer to a cobalt-iron boron alloy and an iron-vanadium alloy, respectively, that may be within the stoichiometry ranges described herein. Thus, the use of CoFeB and FeV are not intended to indicate that the alloys are equiatomic.

FIG. 1 depicts an exemplary embodiment of a magnetic junction 100 usable in a magnetic devices such as a magnetic memory programmable using spin transfer torque and having a free layer including a diluted magnetic layer. For clarity, FIG. 1 is not to scale. The magnetic junction 100 may be used in a magnetic device such as a spin transfer torque magnetic random access memory (STT-MRAM) and, therefore, in a variety of electronic devices. The magnetic junction 100 may include a pinned layer 104 having a magnetic moment 105, a nonmagnetic spacer layer 106, a free layer 108 having magnetic moment 109, an optional additional nonmagnetic spacer layer 110, and an optional additional pinned layer 112 having magnetic moment 113. The magnetic junction 100 may also include one or more polarization enhancement layers (PELs) 103, 107 and 111. In other embodiments, some or all of the PELs 103, 107 and 111 may be omitted or additional PELs may be employed. Also shown are optional seed layer(s) 102 and capping layer(s) 114. The substrate 101 on which the magnetic junction 100 is formed resides below the seed layers. A bottom contact and a top contact are not shown but may be formed. Similarly, other layers may be present but are not shown for simplicity.

As can be seen in FIG. 1, the magnetic junction 100 is a dual magnetic junction. In another embodiment, the nonmagnetic spacer layer 110 and pinned layer 112 might be omitted. In such an embodiment, the magnetic junction 100 is a bottom pinned magnetic junction. Alternatively, the pinned layer 104 and nonmagnetic spacer layer 106 might be omitted. In such an embodiment, the magnetic junction 100 is a top pinned magnetic junction. Optional pinning layer(s) (not shown) may be used to fix the magnetization of the pinned layer(s) 104 and/or 112. In some embodiments, the optional pinning layer may be an AFM layer or multilayer that pins the magnetization(s) through an exchange-bias interaction. However, in other embodiments, the optional pinning layer may be omitted or another structure may be used. In the embodiment shown, the magnetic moments 105 and 113 of the pinned layers 104 and 112, respectively, are pinned by the magnetic anisotropy of the layers 104 and 112, respectively. The free layer 108 and the pinned layers 104 and 112 have a high perpendicular magnetic anisotropy. Stated differently, the perpendicular magnetic anisotropy energy exceeds the out-of-plane demagnetization energy for the layers 104, 108 and 112. Such a configuration allows for the magnetic moments 105, 109 and 113 of the layers 104, 108 and 112, respectively, having a high perpendicular magnetic anisotropy to be stable perpendicular to plane. Stated differently, the magnetic moments of the free layer 108 and pinned layer(s) 104 and 112 are stable out-of-plane.

The magnetic junction 100 is also configured to allow the free layer magnetic moment 109 to be switched between stable magnetic states when a write current is passed through the magnetic junction 100. Thus, the free layer 109 is switchable utilizing spin transfer torque when a write current is driven through the magnetic junction 100 in a current perpendicular-to-plane (CPP) direction. The direction of the magnetic moment 109 of the free layer 108 may be read by driving a read current through the magnetic junction 100.

The nonmagnetic spacer layer(s) 106 and 110 may be tunneling barrier layers. For example, the nonmagnetic spacer layer 106 and/or 110 may be a crystalline MgO tunneling barrier with a (100) orientation. Such nonmagnetic spacer layers 106 and 110 may enhance TMR of the magnetic junction 100. The nonmagnetic spacer layer(s) 106 and 110 may also be considered to serve as seed and capping layers for the free layer 108.

The pinned layer(s) 104 and/or 112 have a perpendicular magnetic anisotropy energy greater than a pinned layer out-of-plane demagnetization energy. Thus, the moments 105 and 113 are stable perpendicular-to-plane. In alternate embodiments, the magnetic moment(s) 105 and/or 113 may be stable in-plane. The pinned layers 104 and 112 are shown as being simple, single layers. However, in other embodiments, the pinned layer(s) 104 and/or 112 may be multilayer(s). For example, the pinned layer(s) 104 and/or 112 might be a synthetic antiferromagnet (SAF) including two magnetically coupled ferromagnetic layers separated by and sandwiching a nonmagnetic layer, such as Ru. Alternatively, the pinned layer(s) 104 and/or 112 may be high perpendicular anisotropy ($H_k$) multilayer(s). For example, the pinned layer 104 may be a Co/Pt multilayer. Other pinned layer(s) having other structures may be used. In addition, in alternate embodiments, the pinned layer 102 and/or 112 may have the magnetic moment(s) 105 and/or 113, in plane.

The free layer 108 includes at least one diluted magnetic layer. A diluted magnetic layer includes one or more magnetic materials alloyed with one or more nonmagnetic materials. The magnetic material(s) are diluted by the nonmagnetic material(s). Because magnetic material(s) are alloyed with nonmagnetic material(s), the saturation magnetization of the diluted magnetic layer is less than the saturation magnetization of the magnetic material(s) only. Such a decrease in magnetization may be due to one or more factors. The magnetic substitutional effect occurs when a nonmagnetic atoms substitutes for a magnetic atom in the lattice. Because fewer magnetic atoms are present in a given amount of material, the saturation magnetic moment is reduced. The volume of a given amount of material may be increased or decreased in the alloy. For example, a large nonmagnetic atom is used in the alloy, the volume of the material per unit cell may be increased. This may reduce the saturation magnetization. In addition, the induced magnetic moment of the magnetic atoms may be reduced due to a change in the electronic interaction. Thus, for various reasons, the saturation magnetization of the diluted magnetic layer is reduced.

Typically, such a dilution of the magnetic material(s) and reduction of saturation magnetization also dramatically reduces the exchange stiffness of the magnetic layer. However, in the free layer 108, the exchange stiffness(es) of the diluted magnetic layer(s) are substantially maintained. More specifically, the exchange stiffness of the diluted magnetic layer is at least eighty percent of an exchange stiffness for the magnetic material(s). In some embodiments, the exchange stiffness of the diluted magnetic layer is at least ninety percent of the exchange stiffness for the magnetic material(s). In some such embodiments, the exchange stiffness of the diluted magnetic layer is at least ninety-five percent of the exchange stiffness for the magnetic material(s). For some concentrations of the nonmagnetic material(s), the exchange stiffness of the diluted magnetic layer is unchanged or increased from that of the magnetic material(s) despite the reduction in saturation magnetization. In general, the Curie temperature of the alloy for the diluted magnetic layer varies with the exchange stiffness. Thus, the Curie temperature of the diluted magnetic layer may be at least eighty percent of the Curie temperature(s) of the magnetic material(s). In some embodiments, the Curie temperature of the diluted magnetic layer is at least ninety percent of the Curie temperature(s) for the magnetic material(s). In some such embodiments, the Curie temperature of the diluted magnetic layer is at least ninety-five percent of the Curie temperature(s) for the magnetic material(s). For some concentrations of the nonmagnetic material(s), the Curie temperature of the diluted magnetic layer is unchanged or increased from that of the magnetic material(s).

The diluted magnetic layer has a perpendicular magnetic anisotropy energy that is greater than its out-of-plane demagnetization energy. Thus, the magnetization of the diluted magnetic layer may be perpendicular-to-plane. Because the saturation magnetization of the diluted magnetic layer is reduced, the demagnetization field of the diluted magnetic layer is also reduced. Consequently, the diluted magnetic layer may also be made thicker while maintaining the perpendicular-to-plane magnetic moment. The free layer 108 may also be made thicker for the same reasons. For example, the free layer 108 may have a thickness of at least twenty Angstroms and not more than thirty-five Angstroms. The diluted magnetic layer may have a thickness of at least twelve Angstroms and not more than twenty-two Angstroms in such a free layer. In other embodiments, the diluted magnetic layer may have a thickness of at least twenty Angstroms and not more than thirty-five Angstroms.

Examples of materials that may be used in the diluted magnetic layer include Fe as the magnetic material and at least one of V, Mo, Cr, Al, Ga, W, Sb, Ge and Sn as the nonmagnetic material(s) in the alloy. Alloying Fe with these nonmagnetic materials results in a dilution of the Fe magnetic moment and, therefore, a reduced saturation magnetization. In addition, the diluted magnetic layer may have an exchange stiffness that is not substantially reduced for some concentrations. For example, the diluted magnetic layer that includes Fe may include at least one of at least ten atomic percent and not more than twenty-five atomic percent V, greater than zero and not more than five atomic percent Mo, greater than zero and not more than ten atomic percent Cr, greater than zero and not more than twenty atomic percent Al, greater than zero and not more than twenty atomic percent Ga, greater than zero and not more than ten atomic percent W, greater than zero and not more than ten atomic percent Sb, greater than zero and not more than ten atomic percent Ge and greater than zero and not more than ten atomic percent Sn. In some embodiments, the diluted magnetic layer may consist of FeX and wherein X is at least ten atomic percent and not more than twenty-five atomic percent V, greater than zero and not more than five atomic percent Mo, greater than zero and not more than ten atomic percent Cr, greater than zero and not more than twenty atomic percent Al, greater than zero and not more than twenty atomic percent Ga, greater than zero and not more than ten atomic percent W, greater than zero and not more than ten atomic percent Sb, greater than zero and not more than ten atomic percent Ge or greater than zero and not more than ten atomic percent Sn. For example, the diluted magnetic layer is a $Fe_{1-t}V_t$ layer wherein t is at least 0.1 and not more than 0.25.

The free layer 108 may be a multilayer including other layers. For example, the free layer 108 may also include CoFeB layer(s) and/or Fe layer(s) adjoining the diluted magnetic layer. In some embodiments, the CoFeB includes at least ten atomic percent and not more than sixty atomic percent B (i.e. $Co_xFe_yB_z$ where x+y+z=1 and z is at least 0.1 and not more than 0.6). In some such embodiments, the CoFeB includes at least fifteen percent and not more than forty atomic percent B. The free layer 108 might also include multiple diluted magnetic layers.

The layers surrounding the free layer 108 may be tailored to aid the free layer 108 and diluted magnetic layer in maintaining a high perpendicular magnetic anisotropy. For example, a seed layer and/or capping layer may be selected from a set of materials in order to enhance the perpendicular magnetic anisotropy energy. In some embodiments, such a seed layer may include magnesium oxide. Similarly, the capping layer be a magnesium oxide layer. For example, in the dual magnetic junction 100 depicted in FIG. 1, the nonmagnetic spacers 106 and 110 may each be crystalline MgO tunneling barrier layers. Thus, the seed and capping layers would correspond to the nonmagnetic spacer layers 106 and 110, respectively and may consist of MgO. Such nonmagnetic spacer layers 106 and 110 not only improve tunneling magnetoresistance, but may also aid in increasing the perpendicular magnetic anisotropy of the free layer 108. If the layers 110 and 112 are omitted, then the capping layer 114 may include a magnesium oxide layer. It the layers 104 and 106 are omitted, then the seed layer 102 may include magnesium oxide. Other material(s) may be used for the seed layer 102 and capping layer 114 to improve the perpendicular magnetic anisotropy of the free layer 108. Thus, the free layer magnetic moment 109 may have its stable states substantially perpendicular-to-plane.

The magnetic junction 100 having the free layer 108 including a diluted magnetic layer may have improved performance. The free layer 108 may have a reduced saturation magnetization due to the dilution of the magnetic moment. For example, saturation magnetizations below 1000 emu/cc (as compared to a bulk Fe saturation magnetization of approximately 1800 emu/cc) may be obtained. For some materials, such as V, significantly lower saturation magnetizations may be achieved in the concentration ranges described above. However, the exchange stiffness may be maintained. As a result, a thicker free layer 108 may be obtained. In some embodiments, such as those using non-magnetic materials V, Mo, Cr, Al, Ga, Sb, Ge and/or Sn with Fe, low damping may be maintained. As a result, switching current may be reduced. The reduction in switching current may also improve other aspects of performance, such as switching speed. Thus, performance of the magnetic junction 100 and magnetic device employing such a free layer 108 may be enhanced.

Figure 2:
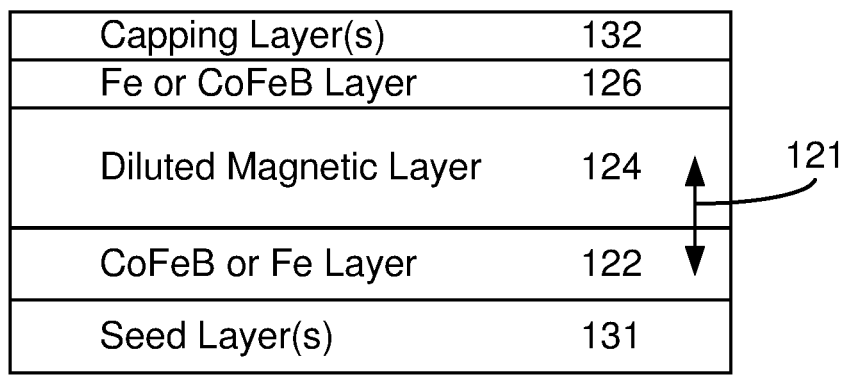
FIG. 2 depicts an exemplary embodiment of a free layer usable in a magnetic junction and including a diluted magnetic layer.

FIG. 2 depicts an exemplary embodiment of a free layer 120 usable in a magnetic devices such as a magnetic memory programmable using spin transfer torque. For clarity, FIG. 2 is not to scale. The free layer 120 may be used as the free layer 108 in the magnetic junction 100. The free layer 120 includes a CoFeB or Fe layer 122, a diluted magnetic layer 124 and an additional Fe or CoFeB layer 126. In some embodiments, the layer(s) 122 and/or 126 may be omitted. However, in some instances, the interface of the diluted magnetic layer 124 coinciding with the interface of the free layer 120 may reduce the perpendicular magnetic anisotropy of the free layer 120. In such instances, the diluted magnetic layer 124 is desired to be surrounded by other magnetic layers 122 and 126. Also shown are seed layer(s) 131 and capping layer(s) 132. However, these layers 131 and 132 are not considered part of the free layer 120.

The diluted magnetic layer 124 is analogous to that described above. Consequently, the diluted magnetic layer 124 may have a lower saturation magnetization, a substantially preserved exchange stiffness and may be thicker. Thus, the exchange stiffness of the diluted magnetic layer 124 is at least eighty percent of an exchange stiffness for the magnetic material(s). In some embodiments, the exchange stiffness of the diluted magnetic layer 124 is at least ninety percent of the exchange stiffness for the magnetic material(s). For some concentrations of the nonmagnetic material(s), the exchange stiffness of the diluted magnetic layer is unchanged or increased from that of the magnetic material(s). For example, if the diluted magnetic layer 124 is an $Fe_{1-t}V_t$ layer, where t is at least 0.1 and not more than 0.25, then the exchange stiffness of the diluted magnetic layer 124 may be at least that of Fe. The Curie temperature of the diluted magnetic layer 124 may vary in an analogous manner.

The diluted magnetic layer 124 and the free layer 120 each has a perpendicular magnetic anisotropy that exceeds the out-of-plane demagnetization energy. Thus, the free layer magnetic moment 121 may have its stable states substantially perpendicular-to-plane. In some embodiments, the high perpendicular magnetic anisotropy of the free layer 120 may be due at least in part to the layers 122 and 126. This is because some diluted magnetic layers 124 may have a reduced perpendicular magnetic anisotropy at interfaces with certain other layers, such as MgO tunneling barrier layers. For example, an FeV diluted magnetic layer may have reduced perpendicular magnetic anisotropy due to such interfaces with MgO. In such embodiments, the layers 122 and/or 126 are desired to be present. Such layers may aid in maintaining the perpendicular magnetic anisotropy of the diluted magnetic layer 124 and, therefore, the free layer 120. The free layer 120 and the diluted magnetic layer 124 may have a thickness as described above. Thus, in some embodiments, the thickness of the diluted magnetic layer 122 may be greater than twenty Angstroms and not more than thirty-two Angstroms while maintaining a perpendicular-to-plane magnetic moment. Similarly, the free layer 120 may have a thickness of at least (or greater than) twenty Angstroms and not more than thirty-five Angstroms while maintaining the perpendicular-to-plane magnetic moment 121.

The bottom layer 122 may be CoFeB or Fe. In some embodiments, the layer 122 is a CoFeB layer having the stoichiometry described above. The layer 122 may also be desired to be thin. In some embodiments, the CoFeB layer or Fe layer 124 is also at least three Angstroms thick and not more than ten Angstroms thick. Similarly, the top layer 126 may be Fe or CoFeB having the stoichiometry described above. In some embodiments, the bottom layer 122 is a CoFeB layer while the top layer 126 is a Fe layer. The top layer 126 is also desired to be thin. In some embodiments, the layer 126 is not more than five Angstroms thick.

In addition, the layers surrounding the free layer 120 may be tailored to aid the layers 122, 124 and 126 and the free layer 120 in maintaining a high perpendicular magnetic anisotropy. For example, the seed layer 131 may include a magnesium oxide layer. Similarly, the capping layer 132 may include a magnesium oxide layer. Other material(s) may be used to improve the perpendicular magnetic anisotropy of the free layer 120. The material selected may depend upon the type of magnetic junction (dual, bottom pinned or top pinned) and the location of the free layer 120.

A magnetic junction including the free layer 120 may have improved performance. The free layer 120 may have a reduced saturation magnetization due to the low moment of the diluted magnetic layer 124. However, the high perpendicular magnetic anisotropy and exchange stiffness may be maintained. The diluted magnetic layer 124 may also have low damping. As a result, switching current may be reduced. The perpendicular magnetic anisotropy may remain high. Thus, performance of a magnetic junction and magnetic device employing such a free layer 120 may be improved.

Figure 3:
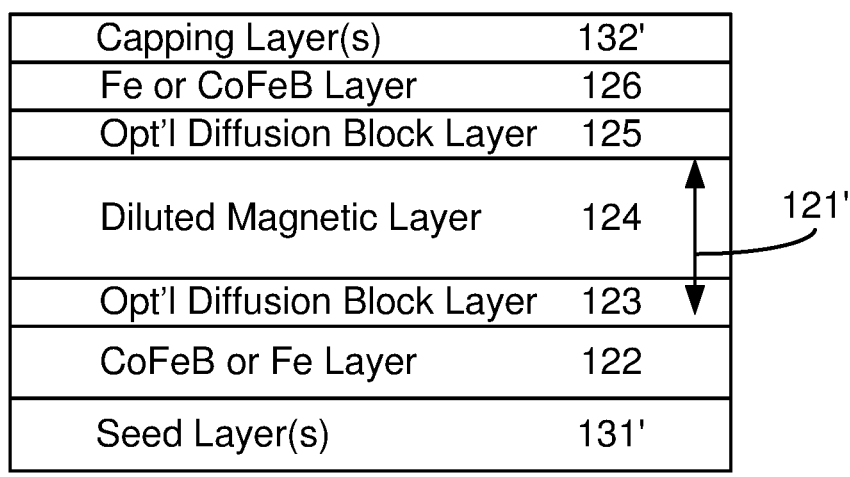
FIG. 3 depicts another exemplary embodiment of a free layer usable in a magnetic junction and including a diluted magnetic layer.

FIG. 3 depicts another exemplary embodiment of a free layer 120' usable in magnetic devices such as a magnetic memory programmable using spin transfer torque. For clarity, FIG. 3 is not to scale. The free layer 120' may be used as the free layer 108 in the magnetic junction 100. The free layer 120' is analogous to the free layer 120. Consequently, similar components have analogous labels. The free layer 120' includes an optional CoFeB or Fe layer 122, a diluted magnetic layer 124 and an optional Fe or CoFeB layer 126. Also shown are seed layer(s) 131' and capping layer(s) 132' that are analogous to the seed layer(s) 131 and the capping layer(s) 132, respectively. However, these layers 131' and 132' are not considered part of the free layer 120'.

In addition, the free layer 120' may include one or more optional diffusion blocking layer(s) 123 and/or 125. The diffusion blocking layers 123 and 125 may be used to prevent diffusion of the nonmagnetic material(s) in the diluted magnetic layer 124. For example, the diffusion blocking layers 123 and 125 may be configured to reduce or prevent diffusion of V from an FeV diluted magnetic layer 124. In some embodiments, only one of the layers 123 and 125 is present. However, in other embodiments, both layers 123 and 125 are used. For example, diffusion blocking layer(s) 123 and 125 may include one or more of Si, Cr, Nb, Re, Ti, Mo, As, Ru, W, Pd and Ta. The diffusion blocking layers 123 and 125 may be sufficiently thin that the perpendicular magnetic anisotropy, ability to be written using spin transfer torque and magnetoresistance of the magnetic junction including the free layer 120' are maintained at a sufficient level for use in a device. The diffusion blocking layers 123 and 125 are also sufficiently thick that they are effective in preventing the nonmagnetic material(s) of the diluted magnetic layer 124 in adversely affecting the remaining portion of the free layer 120' and magnetic junction. In some embodiments, the thickness of each of the diffusion blocking layers 123 and 125 may be at least one Angstrom and not more than four Angstroms.

A magnetic junction including the free layer 120' may have improved performance. The free layer 120' may have a reduced saturation magnetization due to the low moment of the diluted magnetic layer 124. However, the high perpendicular magnetic anisotropy and exchange stiffness may be maintained. The diluted magnetic layer 124 may also have low damping. As a result, switching current performance of a magnetic junction and magnetic device employing such a free layer 120' may be improved.

Figure 4:
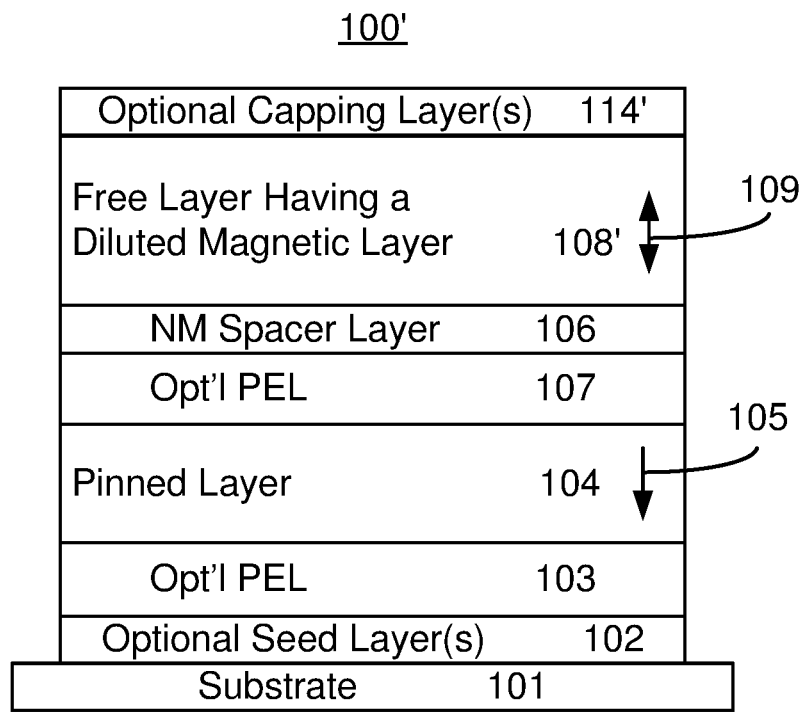
FIG. 4 depicts another exemplary embodiment of a magnetic junction usable in a magnetic devices such as a magnetic memory programmable using spin transfer torque and having a free layer including a diluted magnetic layer.

FIG. 4 depicts another exemplary embodiment of a magnetic junction 100' in magnetic devices such as a magnetic memory programmable using spin transfer torque. For clarity, FIG. 4 is not to scale. The magnetic junction 100' is analogous to the magnetic junction 100. Consequently, similar components have analogous labels. The magnetic junction 100' is a bottom pinned magnetic junction including optional polarization enhancement layer 103, pinned layer 104, optional polarization enhancement layer 107, nonmagnetic spacer layer 106 and free layer 108' that are analogous to the optional polarization enhancement layer 103, pinned layer 104, optional polarization enhancement layer 107, nonmagnetic spacer layer 106 and free layer 108, respectively. Optional seed layer 102 and capping layer 114' are also shown.

The free layer 108' includes a diluted magnetic layer. In some embodiments, the free layer 108' may be the free layer 120 or 120'. In order to improve the perpendicular magnetic anisotropy of the free layer 108', the nonmagnetic spacer layer 106 is desired to be a crystalline MgO layer. Thus, the nonmagnetic spacer layer 106 also serves as a seed layer 131/131'. Such a crystalline MgO tunneling barrier layer 106 may also improve tunneling magnetoresistance and, therefore, signal from the magnetic junction 100'. The capping layers 114' are desired to be analogous to the layer(s) 132 and/or 132'. Thus, the capping layer(s) 114' may include a magnesium oxide layer.

The magnetic junction 100' may have improved performance. The free layer 108' may have a reduced saturation magnetization due to the low moment of the diluted magnetic layer 124. However, the high perpendicular magnetic anisotropy, exchange stiffness and out-of-plane magnetic moment 109 may be maintained. The free layer 108' may also have low damping and increased thickness. As a result, switching performance of a magnetic junction 100' and magnetic device employing the magnetic junction 100' may be improved.

Figure 5:
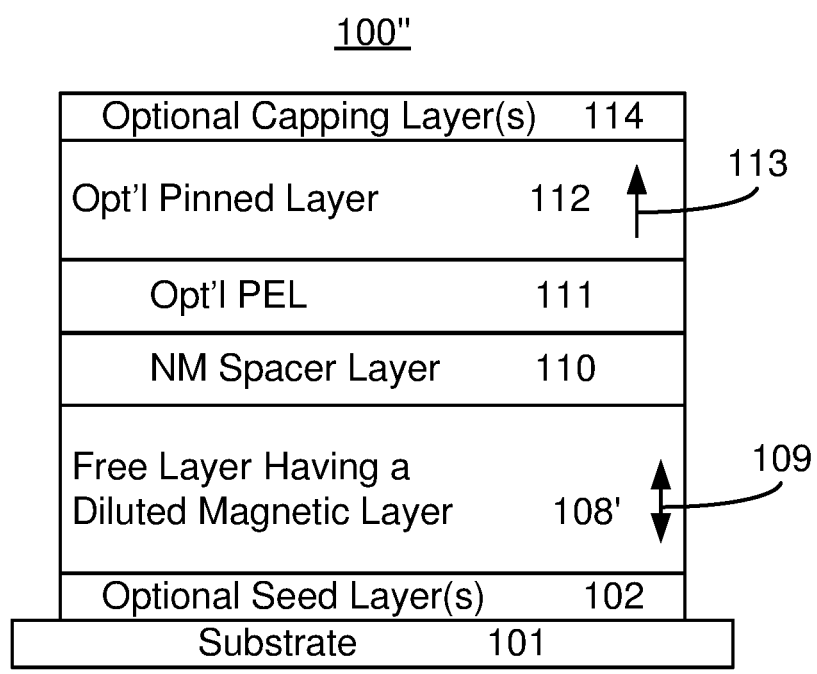
FIG. 5 depicts another exemplary embodiment of a magnetic junction usable in a magnetic devices such as a magnetic memory programmable using spin transfer torque and having a free layer including a diluted magnetic layer.

FIG. 5 depicts another exemplary embodiment of a magnetic junction 100" in a magnetic devices such as a magnetic memory programmable using spin transfer torque. For clarity, FIG. 5 is not to scale. The magnetic junction 100" is analogous to the magnetic junction(s) 100 and/or 100'. Consequently, similar components have analogous labels. The magnetic junction 100" is a top pinned magnetic junction including free layer 108', nonmagnetic spacer layer 110, optional polarization enhancement layer 111 and pinned layer 112 that are analogous to the free layer 108/108', nonmagnetic spacer layer 110, optional polarization enhancement layer 111 and pinned layer 112, respectively. Optional seed layer 102 and capping layer 114 are also shown.

The free layer 108' includes a diluted magnetic layer. In some embodiments, the free layer 108' may be the free layer 120 or 120'. In order to improve the perpendicular magnetic anisotropy of the free layer 108', the nonmagnetic spacer layer 110 is desired to be a crystalline MgO layer. Thus, the nonmagnetic spacer layer 110 also serves as a capping layer 132/132'. Such a crystalline MgO tunneling barrier layer 110 may also improve tunneling magnetoresistance and, therefore, signal from the magnetic junction 100". The seed layers 102' are desired to be analogous to the layer(s) 131 and/or 131'. Thus, the seed layer(s) 102' may include magnesium oxide.

The magnetic junction 100" may have improved performance. The free layer 108' may have a reduced saturation magnetization due to the low moment of the diluted magnetic layer. However, the high perpendicular magnetic anisotropy, exchange stiffness and out-of-plane magnetic moment 109 may be maintained. The free layer 108' may also have low damping and increased thickness. As a result, switching current performance of a magnetic junction 100" and magnetic device employing the magnetic junction 100" may be improved.

Various features have been described with respect to the magnetic junctions 100, 100' and 100" and the free layers 18, 108', 120 and 120'. One of ordinary skill in the art will recognize that these features may be combined in manner(s) not shown and which are not inconsistent with the devices and methods described herein.

Figure 6:
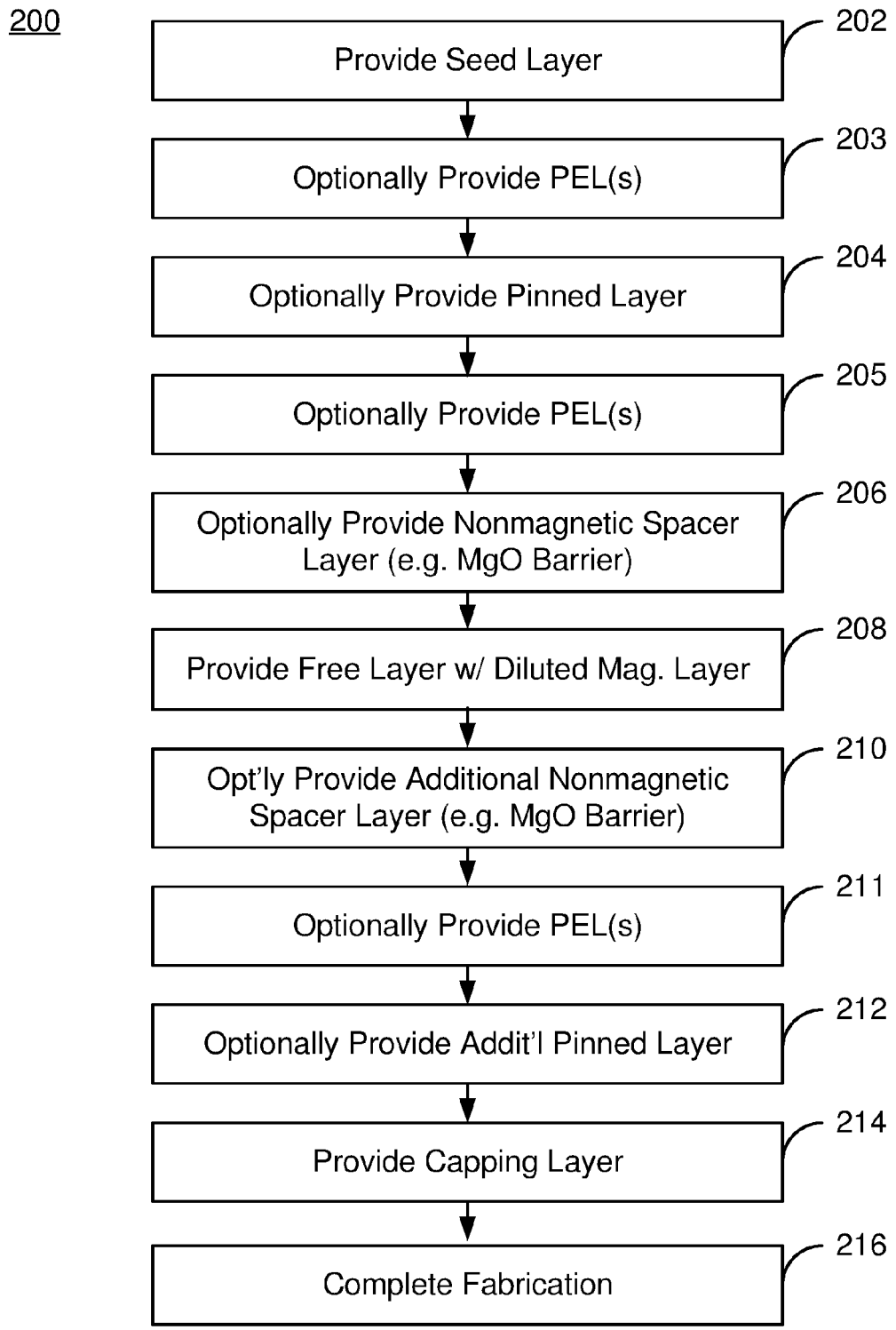
FIG. 6 is a flow chart depicting an exemplary embodiment of a method for providing a magnetic junction usable in a magnetic devices such as a magnetic memory programmable using spin transfer torque and having a free layer including a diluted magnetic layer.

FIG. 6 is a flow chart depicting an exemplary embodiment of a method 200 for providing a layer for magnetic junction usable in a magnetic device and including a diluted magnetic layer within the free layer. For simplicity, some steps may be omitted, performed in another order, include substeps and/or combined. Further, the method 200 start after other steps in forming a magnetic memory have been performed. The method 200 is described in the context of the magnetic junction 100, 100' and 100". However the method 200 may be used in forming other magnetic junction(s) and the free layers 120, 120' and/or 120". Further, multiple magnetic junctions may be simultaneously fabricated.

Seed layer(s) 102 are provided on the substrate, via step 202. Step 202 may include depositing the appropriate seed layer(s) for the pinned layer 104 or for the free layer 108. If the magnetic junction 100 or 100' is being fabricated, then the seed layer(s) for the pinned layer 104 are provided in step 202. If the magnetic junction 100" is being fabricated, then the seed layer(s) 102 for the free layer 108/108' are provided in step 202. Thus, step 202 may include providing a magnesium oxide layer.

In some embodiments, a polarization enhancement layer may be provided for the pinned layer 104, via step 203. For example, step 203 may include depositing a CoFeB layer. In other embodiments, step 203 may be omitted. A pinned layer 104 may be provided, via step 204. Step 204 is performed if the entire dual magnetic junction 100 is to be formed or if a bottom pinned magnetic junction 100' that omits the layers 102 and 104 is to be formed. Step 204 may include providing a multilayer structure having a high perpendicular magnetic anisotropy. Thus, the pinned layer 104 formed in step 204 may be a simple (single) layer or may include multiple layers. For example, the pinned layer formed in step 204 may be a synthetic antiferromagnet including magnetic layers antiferromagnetically or ferromagnetically coupled through thin nonmagnetic layer(s), such as Ru. Each magnetic layer may also include multiple layers. In some embodiments, another polarization enhancement layer may be provided on the pinned layer 104, via step 205. For example, step 205 may include depositing a CoFeB layer. In other embodiments, step 205 may be omitted.

A nonmagnetic spacer layer 106 may be provided, via step 206. Step 206 is performed if the dual magnetic junction 100 or a bottom pinned magnetic junction 100' is to be formed. In some embodiments, a crystalline MgO tunneling barrier layer may be desired for the magnetic junction being formed. Step 206 may include depositing MgO using, for example, radio frequency (RF) sputtering. In other embodiments, metallic Mg may be deposited and then oxidized in step 206 to provide a natural oxide of Mg. The MgO barrier layer/nonmagnetic spacer layer 106 may also be formed in another manner. Step 206 may include annealing the portion of the magnetic junction already formed to provide crystalline MgO tunneling barrier with a (100) orientation for enhanced TMR of the magnetic junction. Because the nonmagnetic spacer layer 106 may also be viewed as a seed layer for the free layer 108/108', step 206 may also be seen as forming seed layer(s) 131 and/or 131'.

A free layer 108/108' is provided, via step 208. Step 208 includes depositing the material(s) for the free layer 108. If steps 204 and 206 are omitted, then the free layer may be deposited on seed layer(s) in step 208. In such embodiments, a top pinned magnetic junction is fabricated. The seed layer(s) may be selected for various purposes including but not limited to the desired crystal structure and magnetic properties of the free layer 108/108'. For example, the free layer 108' may be provided on seed layer(s) 102' such as a crystalline MgO layer that promotes a perpendicular magnetic anisotropy in the free layer 108/108'. If a dual magnetic junction or bottom pinned magnetic junction is fabricated, the free layer may be formed on a nonmagnetic spacer layer provided in step 206. Step 208 may also be viewed as providing the free layer 120 or 120'. Thus, step 208 may include depositing one or more layers including a diluted magnetic layer such as the layer 124. Multiple diluted magnetic layers may also be formed. A CoFeB layer and/or a Fe layer, such as the layer(s) 122 and/or 126, may also be provided. Step 208 may also include cooling the layers that have been provided before depositing the free layer materials. For example, the portion of the magnetic junction 100 that has been deposited may be cooled after step 206 and during step 208. Such a cooling step may include placing the portion of the magnetic junction 100 that has been deposited in a cooling chamber having a temperature less than room temperature (approximately twenty-three degrees Celsius). In some embodiments, the cooling chamber has a temperature of at least eighty Kelvin and not more than three hundred Kelvin.

An additional nonmagnetic spacer layer 110 may be provided, via step 210. Step 210 is performed if a dual magnetic junction 100 or a top pinned magnetic junction 100" is desired to be fabricated. If a bottom pinned magnetic junction is desired, then step 210 is omitted. In some embodiments, an additional crystalline MgO tunneling barrier layer may be desired for the magnetic junction being formed. Step 210 may thus be performed as described above with respect to step 206. For a dual magnetic junction, the nonmagnetic spacer layer 110 may be considered to be the main tunneling barrier layer. Thus, the thickness and crystallinity of the layer 110 may be optimized in step 210.

In some embodiments, a polarization enhancement layer may be provided for the pinned layer 112, via step 211. For example, step 211 may include depositing a CoFeB layer. In other embodiments, step 211 may be omitted. An additional pinned 112 layer may optionally be provided, via step 212. Step 212 may be performed if the dual magnetic junction 100 or top pinned magnetic junction 100" is desired to be fabricated. If a bottom pinned magnetic junction 100' is desired, then step 212 is omitted. The pinned layer 112 formed in step 212 may be a simple (single) layer or may include multiple layers. For example, the pinned layer formed in step 212 may be a SAF.

The capping layer(s) 114 may then be provided, via step 214. If the bottom pinned magnetic junction 100" is being formed, then step 214 may include providing a magnesium oxide layer. Step 214 may thus be seen as providing the capping layer 132 or 132' in some embodiments.

Fabrication of the magnetic junction 100 may then be completed. For example, the edges of the magnetic junction 100 may be defined. This may be accomplished by providing a mask on the layers that have been deposited and ion milling the exposed portions of the layers. In some embodiments, an ion mill may be performed. Thus, the edges of the magnetic junction 100 may be defined after steps 202 through 214 are performed. Alternatively, the edges of various layers may be formed at other times. Additional structures, such as contacts and conductive lines may also be formed for the device in which the magnetic junction is used.

Using the method 200, the magnetic junction 100, the magnetic junction 100' and/or the magnetic junction 100" may be formed. The free layers 108, 108', 120 and/or 120' may be fabricated. As a result, a magnetic junction having free layer(s) with improved switching characteristics may be achieved.

Figure 7:
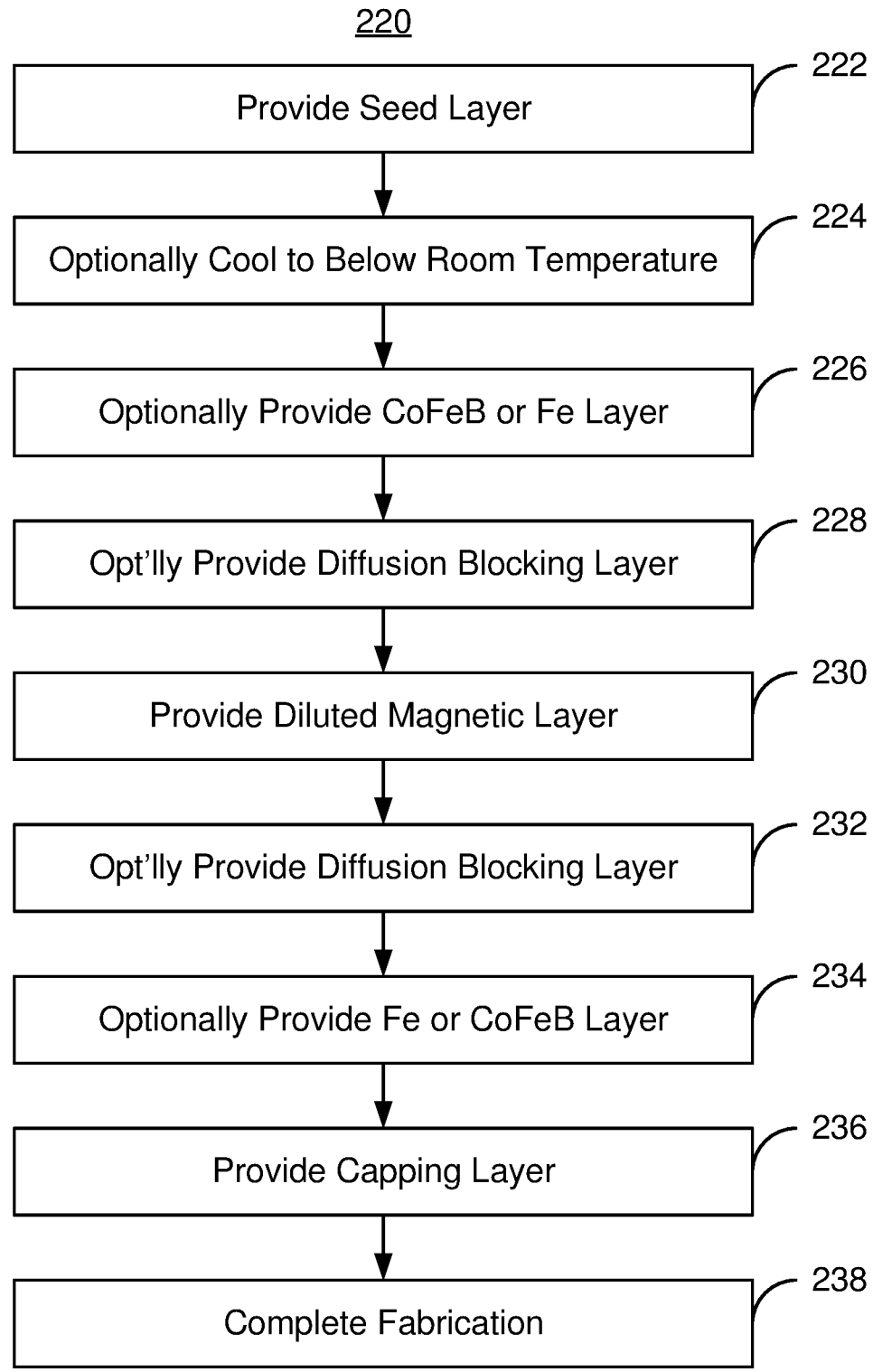
FIG. 7 is a flow chart depicting an exemplary embodiment of a method for providing a free layer including a diluted magnetic layer.

FIG. 7 is a flow chart depicting an exemplary embodiment of a method 220 for providing a free layer for magnetic junction usable in a magnetic device. The method 220 may be used to from the free layer 120 and/or 120'. For simplicity, some steps may be omitted, performed in another order, include substeps and/or combined. Further, the method 220 start after other steps in forming a magnetic memory have been performed. The method 220 is described in the context of the free layers 120 and 120'. However the method 220 may be used in forming other free layer(s). Further, multiple free layers may be simultaneously fabricated.

A seed layer 131/131' that adjoins, or shares an interface with, the free layer 120 is provided, via step 222. In some embodiments, step 222 includes depositing magnesium oxide. In some embodiments, the seed layer provided in step 222 may form a nonmagnetic spacer layer of the magnetic junction being formed. Thus, step 222 technically is not part of forming the free layer.

The seed layer may be cooled to below room temperature, via step 224. Step 224 is optional and might be skipped in some embodiments. When performed, step 224 is completed before deposition of the materials that will form the free layer.

A CoFeB or Fe layer 122 may be provided, via step 226. In some embodiments, the layer formed in step 226 is a CoFeB layer. A diffusion blocking layer 123 may optionally be provided, via step 228. In other embodiments, step 228 may be omitted.

The diluted magnetic layer 124 is provided, via step 230. A diffusion blocking layer 125 may optionally be provided, via step 232. In other embodiments, step 232 may be omitted. If step 228 and/or step 232 is omitted, then for some diluted magnetic alloy layers 124, subsequent anneals may be at a reduced temperature. For example, a FeV diluted magnetic layer may be provided in step 230. In some such embodiments, any subsequent anneals may be at temperatures not exceeding three hundred degrees Celsius in order to reduce or prevent diffusion of the V.

An Fe or CoFeB layer 126 may be provided, via step 234. Together, steps 226 (if performed), 228 (if performed), 230, 232 (if performed) and 234 (if performed) may be viewed as providing at least one of the free layers 120 and 120'.

A capping layer 132 or 132' is provided, via step 236. Step 236 may include providing a magnesium oxide layer. Thus, step 236 technically is not part of forming the free layer. Fabrication of the free layer 120 or 120' may then be completed, via step 238. For example, the edges of the free layer 120 or 120' may be defined.

Using the method 220, the free layers 108, 108', 120 and/or 120' may be fabricated. As a result, a magnetic junction having free layer(s) with improved switching characteristics may be achieved.

Figure 8:
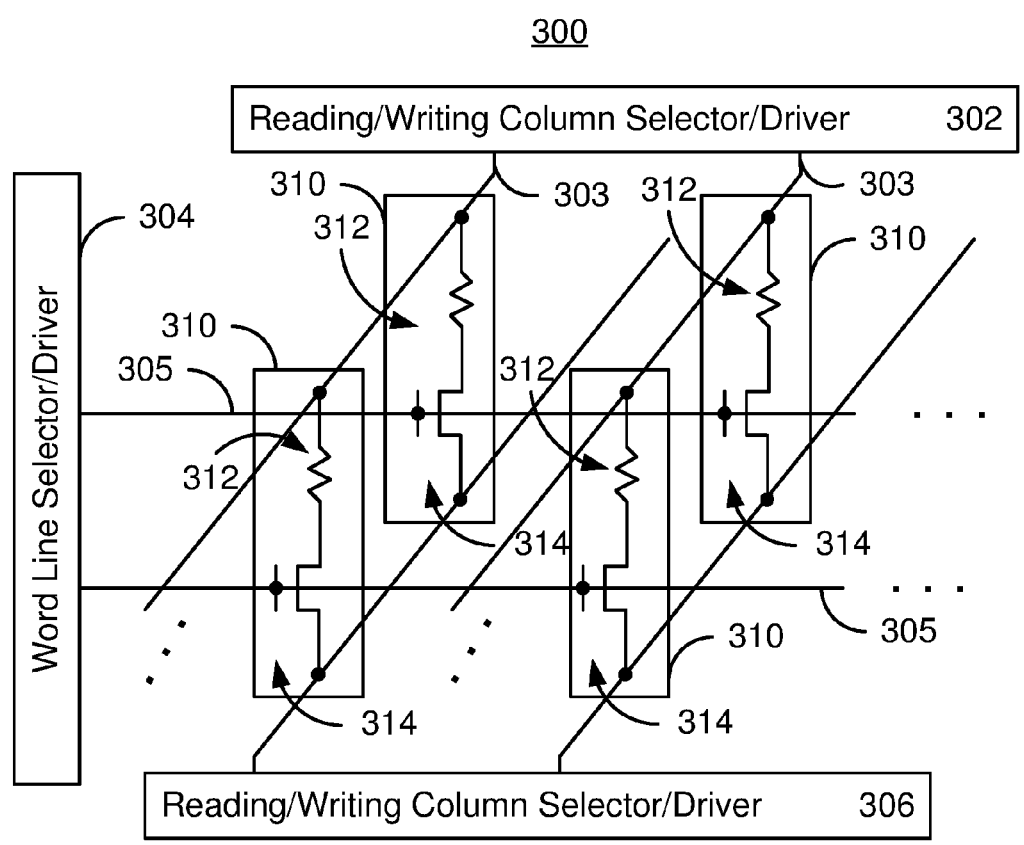
FIG. 8 depicts an exemplary embodiment of a memory utilizing magnetic junctions in the memory element(s) of the storage cell(s).

FIG. 8 depicts an exemplary embodiment of a memory 300 that may use one or more of the magnetic junctions 100, 100' and/or 100" and/or other magnetic junction including a free layer such as the free layer 120 and/or 120'. The magnetic memory 300 includes reading/writing column select drivers 302 and 306 as well as word line select driver 304. Note that other and/or different components may be provided. The storage region of the memory 300 includes magnetic storage cells 310. Each magnetic storage cell includes at least one magnetic junction 312 and at least one selection device 314. In some embodiments, the selection device 314 is a transistor. The magnetic junctions 312 may be one of the 100, 100', 100" and/or other magnetic junction including the diluted magnetic layer within the free layer. Although one magnetic junction 312 is shown per cell 310, in other embodiments, another number of magnetic junctions 312 may be provided per cell. As such, the magnetic memory 300 may enjoy the benefits described above.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction residing on a substrate and usable in a magnetic device comprising:
   a pinned layer;
   a nonmagnetic spacer layer; and
   a free layer, the free layer being switchable between a plurality of stable magnetic states when a write current is passed through the magnetic junction, the nonmagnetic spacer layer residing between the pinned layer and the free layer, the free layer having a free layer perpendicular magnetic anisotropy energy greater than a free layer out-of-plane demagnetization energy, the free layer including a diluted magnetic layer, the diluted magnetic layer having a perpendicular magnetic anisotropy energy and an out-of-plane demagnetization energy, the perpendicular magnetic anisotropy being greater than the out-of-plane demagnetization energy, the diluted magnetic layer including at least one magnetic material and at least one nonmagnetic material, the diluted magnetic layer having an exchange stiffness that is at least eighty percent of an exchange stiffness for the at least one magnetic material.

2. The magnetic junction of claim 1 wherein the at least one magnetic material includes Fe and the at least one nonmagnetic material includes at least one of V, Mo, Cr, Al, Ga, W, Sb, Ge and Sn.

3. The magnetic junction of claim 2 wherein the diluted magnetic layer includes Fe and at least one of at least ten atomic percent and not more than twenty-five atomic percent V, greater than zero and not more than five atomic percent Mo, greater than zero and not more than ten atomic percent Cr, greater than zero and not more than twenty atomic percent Al, greater than zero and not more than twenty atomic percent Ga, greater than zero and not more than ten atomic percent W, greater than zero and not more than ten atomic percent Sb, greater than zero and not more than ten atomic percent Ge and greater than zero and not more than ten atomic percent Sn.

4. The magnetic junction of claim 2 wherein the diluted magnetic layer consists of Fe—X and wherein X is at least one of at least ten atomic percent and not more than twenty-five atomic percent V, greater than zero and not more than five atomic percent Mo, greater than zero and not more than ten atomic percent Cr, greater than zero and not more than twenty atomic percent Al, greater than zero and not more than twenty atomic percent Ga, greater than zero and not more than ten atomic percent W, greater than zero and not more than ten atomic percent Sb, greater than zero and not more than ten atomic percent Ge and greater than zero and not more than ten atomic percent Sn.

5. The magnetic junction of claim 1 wherein the free layer also includes at least one of at least one CoFeB layer and at least one Fe layer adjoining the diluted magnetic layer.

6. The magnetic junction of claim 1 wherein the diluted magnetic layer is $Fe_{1-t}V_t$ and wherein t is at least 0.1 and not more than 0.25.

7. The magnetic junction of claim 1 wherein the exchange stiffness that is at least ninety percent of the Fe exchange stiffness.

8. The magnetic junction of claim 1 wherein the free layer has a thickness of at least twenty Angstroms and not more than thirty-five Angstroms.

9. The magnetic junction of claim 8 wherein the diluted magnetic layer has a diluted magnetic layer thickness of at least twelve Angstroms and not more than twenty-two Angstroms.

10. The magnetic junction of claim 1 wherein the nonmagnetic spacer layer includes MgO and adjoins the free layer.

11. The magnetic junction of claim 1 further comprising:
an additional nonmagnetic spacer layer, the free layer being between the additional nonmagnetic spacer layer and the nonmagnetic spacer layer; and
an additional pinned layer, the additional nonmagnetic spacer layer being between the additional pinned layer and the free layer.

12. The magnetic junction of claim 1 wherein the free layer further includes:
at least one diffusion blocker layer adjacent to the diluted magnetic layer.

13. A magnetic memory residing on a substrate and comprising:
a plurality of magnetic storage cells, each of the plurality of magnetic storage cells including at least one magnetic junction including a pinned layer, a nonmagnetic spacer layer and a free layer, the free layer being switchable between a plurality of stable magnetic states when a write current is passed through the magnetic junction, the nonmagnetic spacer layer residing between the pinned layer and the free layer, the free layer having a free layer perpendicular magnetic anisotropy energy greater than a free layer out-of-plane demagnetization energy, the free layer including a diluted magnetic layer, the diluted magnetic layer having a perpendicular magnetic anisotropy energy and an out-of-plane demagnetization energy, the perpendicular magnetic anisotropy being greater than the out-of-plane demagnetization energy, the diluted magnetic layer including at least one magnetic material and at least one nonmagnetic material, the diluted magnetic layer having an exchange stiffness that is at least eighty percent of an exchange stiffness for the at least one magnetic material;
a plurality of bit lines coupled with the plurality of magnetic storage cells.

14. A method for providing magnetic junction residing on a substrate and usable in a magnetic device, the method comprising:
providing a pinned layer;
providing a nonmagnetic spacer layer; and
providing a free layer, a free layer, the free layer being switchable between a plurality of stable magnetic states when a write current is passed through the magnetic junction, the nonmagnetic spacer layer residing between the pinned layer and the free layer, the free layer having a free layer perpendicular magnetic anisotropy energy greater than a free layer out-of-plane demagnetization energy, the step of providing the free layer further including
providing a diluted magnetic layer, the diluted magnetic layer having a perpendicular magnetic anisotropy energy and an out-of-plane demagnetization energy, the perpendicular magnetic anisotropy being greater than the out-of-plane demagnetization energy, the diluted magnetic layer including at least one magnetic material and at least one nonmagnetic material, the diluted magnetic layer having an exchange stiffness that is at least eighty percent of an exchange stiffness for the at least one magnetic material.

15. The method of claim 14 wherein the at least one magnetic material includes Fe and the at least one nonmagnetic material includes at least one of V, Mo, Cr, Al, Ga, W, Sb, Ge and Sn.

16. The method of claim 15 wherein the step of providing the diluted magnetic layer further includes:
providing Fe and at least one of at least ten atomic percent and not more than twenty-five atomic percent V, not more than five atomic percent Mo, not more than ten atomic percent Cr, not more than twenty atomic percent Al, not more than ten atomic percent Ga, not more than four atomic percent W, Sb, Ge and Sn.

17. The method of claim 15 wherein the step of providing the free layer further includes:
providing at least one of at least one CoFeB layer and at least one Fe layer adjoining the diluted magnetic layer.

18. The method of claim 15 wherein the exchange stiffness that is at least ninety percent of the Fe exchange stiffness.

19. The method of claim 15 wherein the free layer has a thickness of at least twenty Angstroms and not more than thirty-five Angstroms.

20. The method of claim 15 wherein the step of providing the free layer further includes:
providing at least one diffusion blocker layer adjacent to the diluted magnetic layer.

* * * * *